(12) United States Patent
Lu et al.

(10) Patent No.: US 12,151,934 B2
(45) Date of Patent: Nov. 26, 2024

(54) DEVICE AND METHOD OF EQUALIZING LOW FREQUENCY ROLL OFF FOR WEARABLE SOUND DEVICE

(71) Applicant: xMEMS Labs, Inc., Santa Clara, CA (US)

(72) Inventors: Yanchen Lu, Campbell, CA (US); Jemm Yue Liang, Sunnyvale, CA (US); Michael David Housholder, San Jose, CA (US); Jengyaw Jiang, Saratoga, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 18/434,743

(22) Filed: Feb. 6, 2024

(65) Prior Publication Data

US 2024/0174508 A1  May 30, 2024

Related U.S. Application Data

(60) Continuation-in-part of application No. 17/955,562, filed on Sep. 29, 2022, which is a division of
(Continued)

(51) Int. Cl.
*B81B 3/00* (2006.01)
*H04R 31/00* (2006.01)

(52) U.S. Cl.
CPC .......... *B81B 3/0021* (2013.01); *B81B 3/0051* (2013.01); *B81B 3/0072* (2013.01);
(Continued)

(58) Field of Classification Search
CPC ... B81B 3/0021; B81B 3/0051; B81B 3/0072; B81B 2201/0257; B81B 2203/0127;
(Continued)

(56) References Cited

U.S. PATENT DOCUMENTS 5,970,998 A 10/1999 Talbot
8,532,320 B2 9/2013 Nordahn
(Continued)

FOREIGN PATENT DOCUMENTS

CN 101785327 A 7/2010
CN 104540776 A 4/2015
(Continued)

OTHER PUBLICATIONS

Liang, the specification, including the claims, and drawings in the U.S. Appl. No. 17/344,983, filed Jun. 11, 2021.
(Continued)

*Primary Examiner* — Carolyn R Edwards
*Assistant Examiner* — Julie X Dang
(74) *Attorney, Agent, or Firm* — Winston Hsu

(57) ABSTRACT

A wearable sound device includes a venting module, configured to form at least one vent to connect a volume within the wearable sound device and ambient, and a sound producing device, configured to produce sound according to an equalized input signal. The venting module, including at least one venting device, operates among a plurality of statuses corresponding to a plurality of degrees of opening. A controller generates the equalized input signal according to a degree of opening among the plurality of degrees of opening, in order to counteract a roll off caused by the at least one vent.

28 Claims, 9 Drawing Sheets

Related U.S. Application Data application No. 17/842,810, filed on Jun. 17, 2022, now Pat. No. 11,884,535, which is a continuation-in-part of application No. 17/344,980, filed on Jun. 11, 2021, now Pat. No. 11,399,228.

(60) Provisional application No. 63/050,763, filed on Jul. 11, 2020, provisional application No. 63/051,885, filed on Jul. 14, 2020, provisional application No. 63/171,919, filed on Apr. 7, 2021, provisional application No. 63/320,703, filed on Mar. 17, 2022, provisional application No. 63/447,340, filed on Feb. 21, 2023, provisional application No. 63/464,190, filed on May 4, 2023.

(52) U.S. Cl.
CPC ...... *H04R 31/00* (2013.01); *B81B 2201/0257* (2013.01); *B81B 2203/0127* (2013.01); *B81B 2203/0163* (2013.01); *B81B 2207/03* (2013.01)

(58) Field of Classification Search
CPC ........ B81B 2203/0163; B81B 2207/03; H04R 31/00; H04R 19/04; H04R 29/001; H04R 1/28; H04R 3/007; H04R 1/025; H04R 3/04; H04R 2201/003; H04R 2430/01
USPC .................................. 381/170–180, 150–153
See application file for complete search history.

(56) References Cited

U.S. PATENT DOCUMENTS

| | | | |
|---|---|---|---|
| 8,724,200 B1 | 5/2014 | Wu | |
| 10,067,734 B2 | 9/2018 | Watson | |
| 10,367,540 B1 | 7/2019 | Medapalli | |
| 11,323,797 B2 | 5/2022 | Liang | |
| 11,399,228 B2 | 7/2022 | Liang | |
| 2003/0029705 A1 | 2/2003 | Qiu | |
| 2006/0131163 A1 | 6/2006 | Mei | |
| 2007/0007858 A1 | 1/2007 | Sorensen | |
| 2008/0267416 A1 | 10/2008 | Goldstein | |
| 2010/0020991 A1 | 1/2010 | Chen | |
| 2011/0013300 A1 | 1/2011 | Wu | |
| 2011/0051985 A1 | 3/2011 | Hwang | |
| 2011/0103616 A1 | 5/2011 | Kwon | |
| 2011/0181150 A1* | 7/2011 | Mahameed | H01H 57/00 29/25.35 |
| 2012/0053393 A1 | 3/2012 | Kaltenbacher | |
| 2012/0082335 A1 | 4/2012 | Duisters | |
| 2013/0121509 A1 | 5/2013 | Hsu | |
| 2013/0223023 A1 | 8/2013 | Dehe | |
| 2014/0140558 A1 | 5/2014 | Kwong | |
| 2015/0163599 A1 | 6/2015 | Shim | |
| 2015/0204940 A1 | 7/2015 | Teeter | |
| 2015/0237438 A1 | 8/2015 | Lee | |
| 2016/0176704 A1 | 6/2016 | Cargill | |
| 2016/0381464 A1 | 12/2016 | Elyada | |
| 2017/0011600 A1 | 1/2017 | Joung | |
| 2017/0021391 A1 | 1/2017 | Guedes | |
| 2017/0040012 A1 | 2/2017 | Goldstein | |
| 2017/0041708 A1* | 2/2017 | Barzen | G10K 15/04 |
| 2017/0164115 A1 | 6/2017 | van Halteren | |
| 2017/0201192 A1* | 7/2017 | Tumpold | H04R 7/06 |
| 2017/0217761 A1 | 8/2017 | Chung | |
| 2017/0260044 A1 | 9/2017 | Cargill | |
| 2017/0325030 A1 | 11/2017 | Stoppel | |
| 2018/0002168 A1* | 1/2018 | Cargill | B81B 3/0072 |
| 2018/0020194 A1 | 1/2018 | Kim | |
| 2018/0120938 A1 | 5/2018 | Frescas | |
| 2019/0039880 A1* | 2/2019 | Paci | B81B 3/0021 |
| 2019/0098390 A1 | 3/2019 | Carino | |
| 2019/0181776 A1 | 6/2019 | Tumpold | |
| 2019/0208343 A1 | 7/2019 | Monti | |
| 2019/0215620 A1* | 7/2019 | Albahri | H04R 25/554 |
| 2019/0349665 A1 | 11/2019 | Grinker | |
| 2020/0100033 A1* | 3/2020 | Stoppel | H04R 31/003 |
| 2020/0178000 A1 | 6/2020 | Niekiel | |
| 2020/0178003 A1 | 6/2020 | Zurbruegg | |
| 2020/0193973 A1 | 6/2020 | Tolomei | |
| 2020/0196067 A1* | 6/2020 | Rusconi Clerici Beltrami | H04R 1/24 |
| 2020/0211521 A1* | 7/2020 | Voss | H04R 7/04 |
| 2020/0213770 A1* | 7/2020 | Duan | H04R 17/02 |
| 2020/0244275 A1 | 7/2020 | Marzin | |
| 2020/0352788 A1* | 11/2020 | Van 'T Hof | H04R 1/1016 |
| 2022/0014836 A1 | 1/2022 | Liang | |
| 2022/0225031 A1 | 7/2022 | Liang | |

FOREIGN PATENT DOCUMENTS

| | | |
|---|---|---|
| CN | 105009604 A | 10/2015 |
| CN | 106937193 A | 7/2017 |
| CN | 107223346 A | 9/2017 |
| CN | 108702575 A | 10/2018 |
| CN | 110022506 A | 7/2019 |
| CN | 209402687 U | 9/2019 |
| CN | 111063790 A | 4/2020 |
| EP | 3 896 990 A1 | 10/2021 |
| JP | 11-307441 A | 11/1999 |
| JP | 2009-512375 A | 3/2009 |
| JP | 2012-249184 A | 12/2012 |
| JP | 2016-51915 A | 4/2016 |
| JP | 2017-112531 A | 6/2017 |
| JP | 2020-31444 A | 2/2020 |
| JP | 2022-16392 A | 1/2022 |
| KR | 10-2010-0002351 A | 1/2010 |
| KR | 10-2012-0034085 A | 4/2012 |
| KR | 10-2015-0030691 A | 3/2015 |
| KR | 10-2015-0097292 A | 8/2015 |
| KR | 10-2017-0139320 A | 12/2017 |
| KR | 10-2022-0007717 A | 1/2022 |
| KR | 10-2022-0103042 A | 7/2022 |
| TW | I650025 B | 2/2019 |
| TW | 202203662 A | 1/2022 |
| WO | 2019/177324 A1 | 9/2019 |
| WO | 2021/202023 A1 | 10/2021 |

OTHER PUBLICATIONS

Hyonse Kim et al, A slim type microvalve driven by PZT films, Sensors and Actuators A: Physical, Jan. 18, 2005, pp. 162-171, vol. 121, Elsevier B. V., XP027806904.

Shen Guohao et al., Structure optimization design for capacitive silicon-based MEMS microphone, Semiconductor Devices, vol. 43, No. 12, p. 912-917, China Academic Journal Electronic Publishing House. ,Dec. 3, 2018.

Hua Qing et al., Acoustoeletric model of piezoelectric microphone with package structure, Transducer and Microsystem Technologies, 2018 vol. 37, No. 11, p. 42-44, China Academic Journal Electronic Publishing House. ,Nov. 30, 2018.

Chen Guidong et al., Highly sensitive MEMS humidity sensor based on candle-soot nanoparticle layer, Micronanoelectronic Technology, vol. 57, No. 1, p. 36-40, p. 48, China Academic Journal Electronic Publishing House ,Jan. 2020.

Wang Zhicheng, Stylish structure and innovative features of new generation speakers, Household Electric Appliances, Issue 12, 2003, p. 38-40, China Academic Journal Electronic Publishing House ,2003.

Zhou Xiao-wei et al., Preliminary evaluation of predicative performance of BAHA softband in the conductive or mixed hearing loss patients, Journal of Otolaryngology and Ophthalmology of Shandong University, vol. 29, Issue No. 2, 2015, p. 28-30, China Academic Journal Electronic Publishing House. ,Apr. 16, 2015.

Stefan Iiebich, active occlusion cancellation with hear-through equalization for headphones, 2018 IEEE international conference on acoustics speech and signal processing. ,Apr. 2018.

\* cited by examiner

200
DEVICE AND METHOD OF EQUALIZING LOW FREQUENCY ROLL OFF FOR WEARABLE SOUND DEVICE

CROSS REFERENCE TO RELATED APPLICATIONS

This application is a continuation-in-part of U.S. application Ser. No. 17/955,562, filed on Sep. 29, 2022, which is a division of U.S. application Ser. No. 17/842,810, filed on Jun. 17, 2022, which is a continuation-in-part of U.S. application Ser. No. 17/344,980, filed on Jun. 11, 2021, which claims the benefit of U.S. Provisional Application No. 63/050,763, filed on Jul. 11, 2020, and claims the benefit of U.S. Provisional Application No. 63/051,885, filed on Jul. 14, 2020, and claims the benefit of U.S. Provisional Application No. 63/171,919, filed on Apr. 7, 2021. Besides, U.S. application Ser. No. 17/842,810 claims the benefit of U.S. Provisional Application No. 63/320,703, filed on Mar. 17, 2022. Further, this application claims the benefit of U.S. Provisional Application No. 63/447,340, filed on Feb. 21, 2023. Further, this application claims the benefit of U.S. Provisional Application No. 63/464,190, filed on May 4, 2023. The contents of these applications are incorporated herein by reference.

BACKGROUND OF THE INVENTION

1. Field of the Invention

The present invention relates to a wearable sound device, a controller, and an equalization method, and more particularly, to a wearable sound device, a controller, and an equalization method improving user experience.

2. Description of the Prior Art

Occlusion effect arises from the sealed volume of an ear canal, which causes perceived pressure for the listener. For example, occlusion effect occurs when the listener wearing a wearable sound device in his/her ear canal engages in specific movement(s) that generates bone-conducted sound (e.g., jogging). However, releasing the pressure inside a closed field chamber may impact frequency response and face severe low frequency roll off problem, which degrade user experience especially in low-frequency bass part of music. There is room for further improvement when it comes to audio quality optimization.

SUMMARY OF THE INVENTION

It is therefore a primary objective of the present application to provide a wearable sound device, a controller, and an equalization method, to improve over disadvantages of the prior art.

An embodiment of the present application discloses a wearable sound device, comprising a venting module, comprising at least one venting device, and a sound producing device, configured to produce sound according to an equalized input signal; wherein the venting module configured to form at least one vent to connect a volume within the wearable sound device and ambient operates among a plurality of statuses corresponding to a plurality of degrees of opening; wherein a controller generates the equalized input signal according to a degree of opening among the plurality of degrees of opening, in order to counteract a roll off caused by the at least one vent.

An embodiment of the present application discloses a device, comprising a controller, configured to generate an equalized input signal according to a degree of opening among a plurality of degrees of opening of a venting module; wherein the venting module is configured to form at least one vent and has the plurality of degrees of opening; wherein the controller generating the equalized input signal is to counteract a roll off due to the at least one vent.

An embodiment of the present application discloses an equalizing method, configured to generate an equalized input signal for a sound producing device, the equalizing method comprising obtaining a status of a venting module among a plurality of statuses; and generating the equalized input signal according to the status, wherein the venting module forming at least one vent operates among the plurality of statuses corresponding to a plurality of degrees of opening.

An embodiment of the present application discloses a wearable sound device, comprising an acoustic transducer, configured to form at least one opening to connect a volume within the wearable sound device and ambient and configured to produce sound according to an equalized input signal; wherein the acoustic transducer operates among a plurality of statuses corresponding to a plurality of degrees of opening; wherein a controller generates the equalized input signal according to a degree of opening among the plurality of degrees of opening, in order to counteract a roll off caused by at least one vent.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
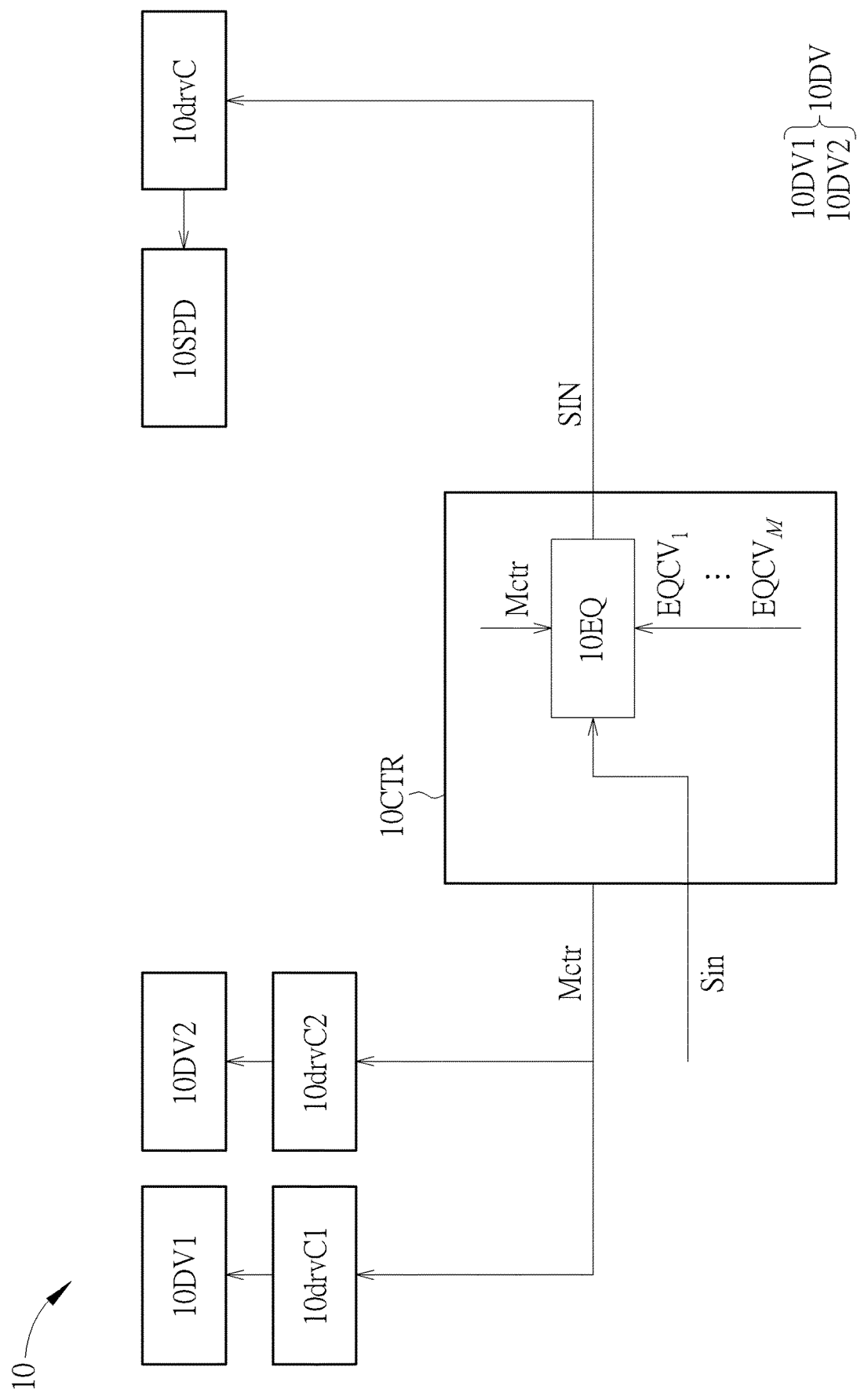
FIG. 1 is a schematic diagram of an audio system according to an embodiment of the present application.

FIG. 1 is a schematic diagram of an audio system 10 according to an embodiment of the present application. The audio system 10 may include venting devices 10DV1, 10DV2, a sound producing device 10SPD, driving circuits 10drvC, 10drvC1, 10drvC2, and a controller 10CTR. The venting devices 10DV1, 10DV2 and the sound producing device 10SPD may be disposed within a wearable sound device, such as an in-ear sound device, an earbud or a hearing-aid. The controller 10CTR may include an equalizer 10EQ, where the equalizer 10EQ may be referred to a part/portion of the controller 10CTR which performs operations related to the equalization disclosed in the present application. The venting devices 10DV1, 10DV2 may be together regarded/formed as a venting module 10DV.

Figure 5:
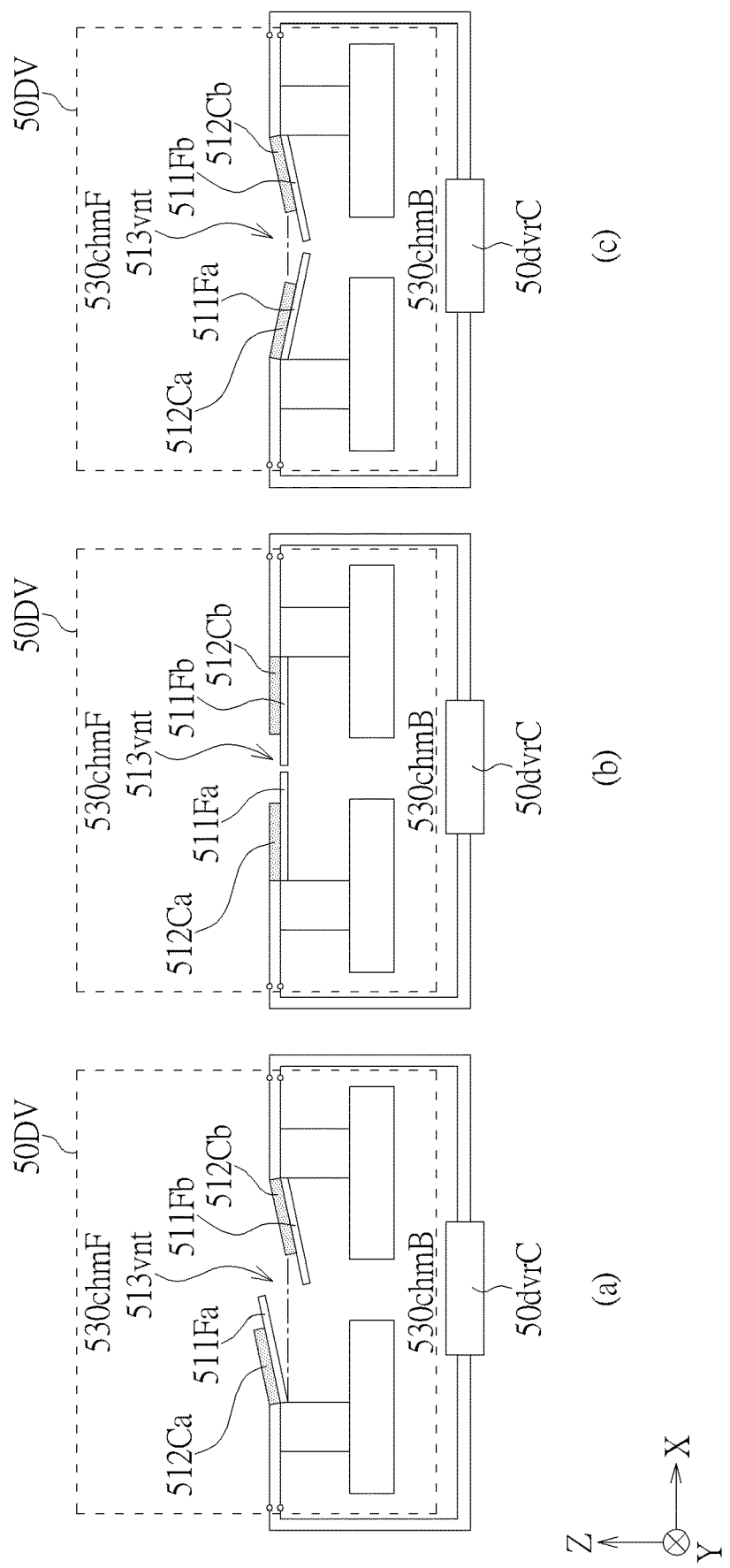
FIG. 5 is a schematic diagram of three different modes of a venting device according to an embodiment of the present application.

The venting device 10DV1/10DV2 may operate in an open mode (e.g., FIG. 5 (a)) to form a vent (e.g., 513vnt shown in FIG. 5), in a close mode (e.g., FIG. 5 (b)) to seal the vent, or in a comfort mode (e.g., FIG. 5 (c)) to slightly open the vent. However, different statuses of the venting module 10DV would lead to different frequency responses (e.g., low frequency roll off (LFRO)) since the venting device 10DV1/10DV2 may influence the sound transmission channel.

Figure 2:
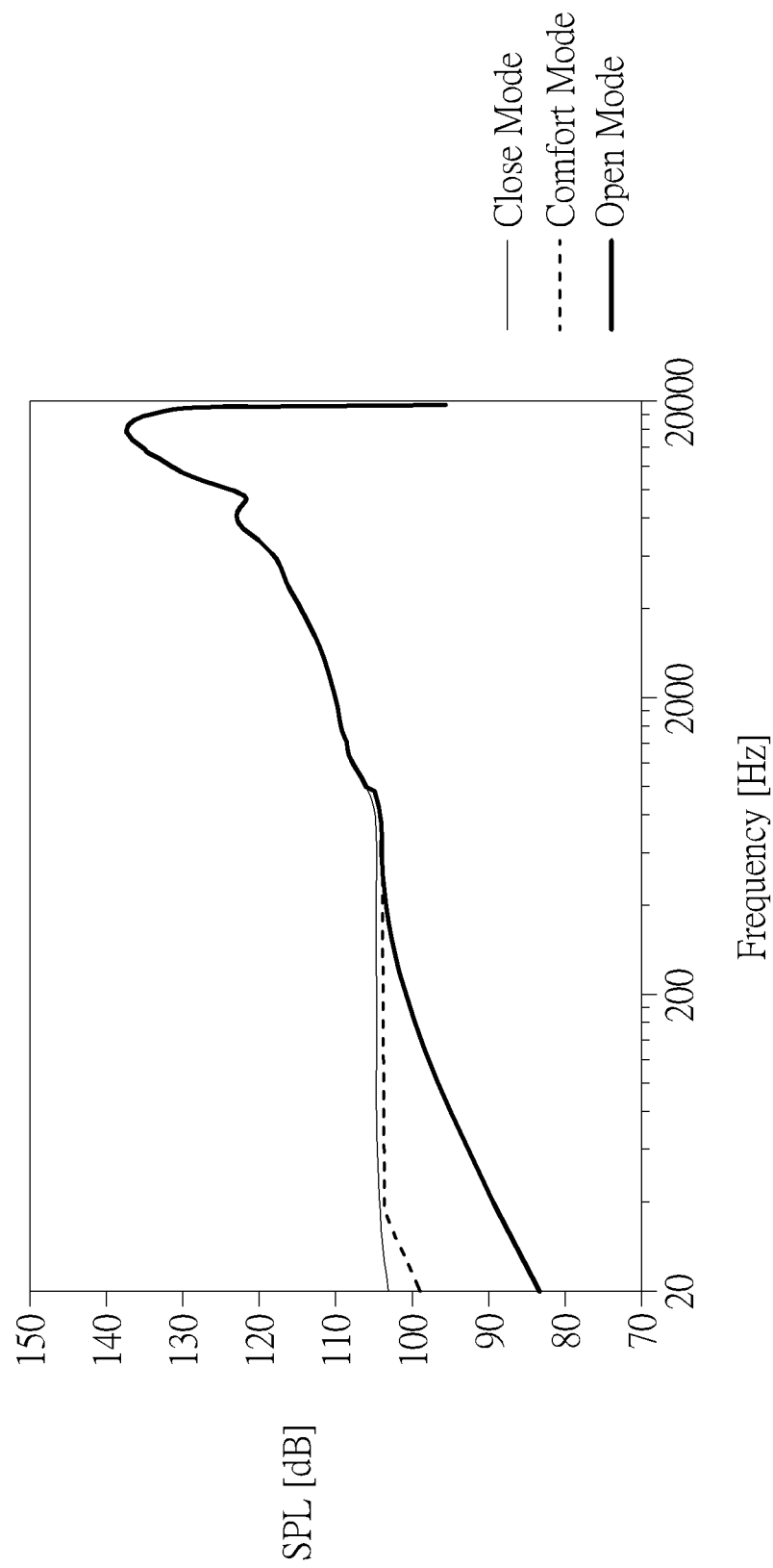
FIG. 2 is a schematic diagram of frequency response corresponding to one venting device according to an embodiment of the present application.
Figure 3:
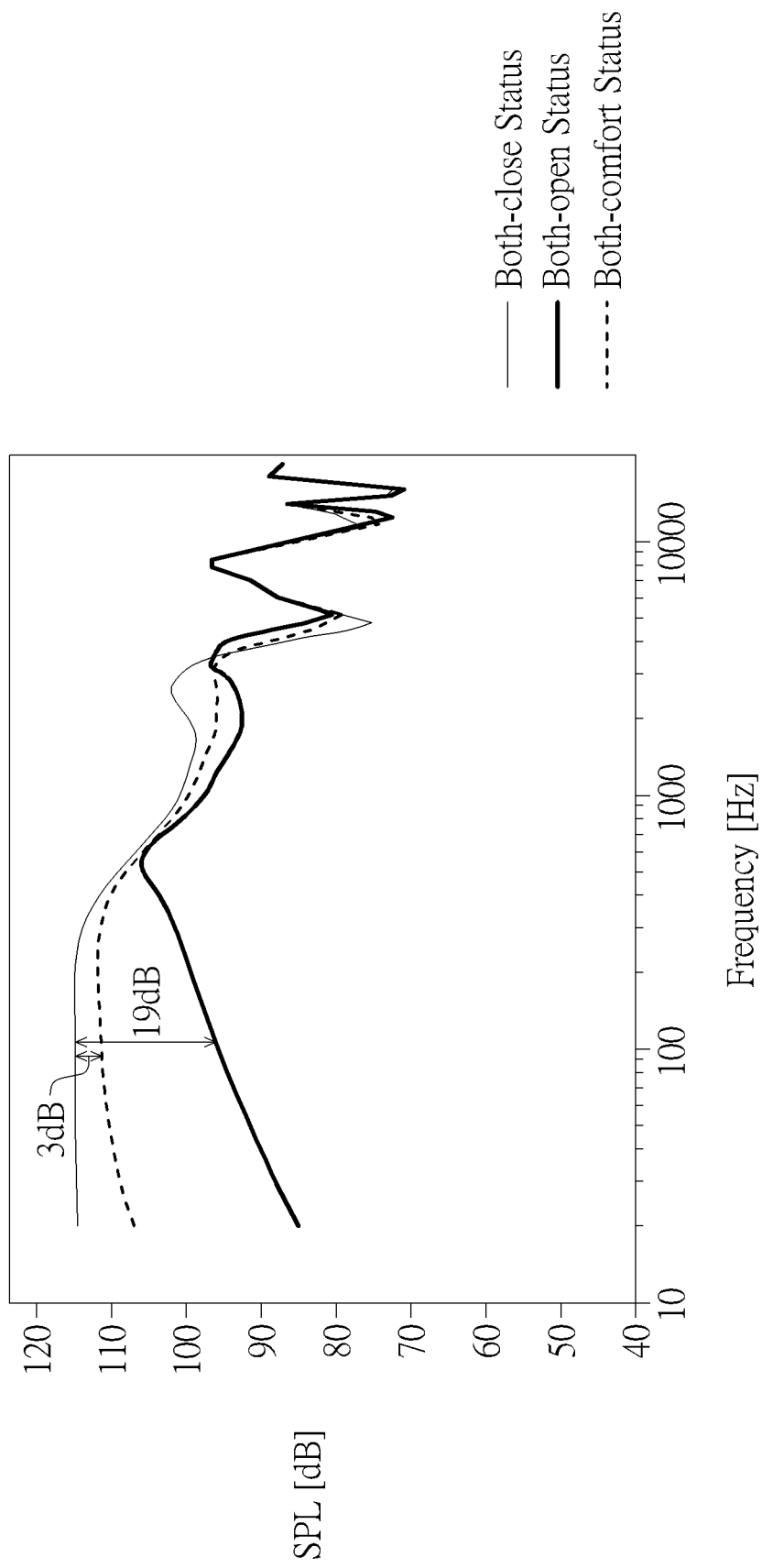
FIG. 3 is a schematic diagram of frequency response corresponding to two venting device according to an embodiment of the present application.

For example, FIG. 2 is a schematic diagram of frequency response corresponding to single venting device configuration without/before equalization. In FIG. 2 (each bud features a single venting device (e.g., 10DV1) and houses a single MEMS speaker (1-way)), below 100 Hz the frequency response corresponding to the comfort mode/status (i.e., the dashed curve) rolls off slightly, while the frequency response corresponding to the open mode/status (i.e., the thick solid curve) exhibits a more pronounced/significant roll-off at/toward low frequencies. FIG. 3 is a schematic diagram of frequency response corresponding to two venting devices configuration without/before equalization. In FIG. 3 (each bud is equipped with dual venting devices (e.g., 10DV1 and 10DV2) and contains one Dynamic Driver (DD) and one MEMS speaker (2-way)), low frequency roll off is severe when the two venting devices have their vents open in a both-open status (i.e., the thick solid curve). However, the frequency response curve remains substantially flat at low frequencies when the two venting devices have their vents close in a both-close status (i.e., the thin solid curve). In other words, a status which vents more sound/air from one side to another may result in weaker low frequency sounds produced by the sound producing device 10SPD, measured within a closed or semi-closed cavity (e.g., an ear canal or an ear simulator/coupler (such as 711)), compared to other statuses.

To compensate for (low frequency) roll off across different statuses of the venting module 10DV, the equalizer 10EQ may generate equalized input signal by exploiting different equalization curves to perform equalization. This involves the equalizer 10EQ, which is able to obtain/access a plurality of equalization curves $EQCV_1$-$EQCV_M$, choosing a specific equalization curve (e.g., $EQCV_1$) corresponding to a status (e.g., the both-open status) of the venting module 10DV. The selection of the equalizer 10EQ (or generating the equalized input signal) aims to compensate/counteract roll off effect caused by the vent(s), which is related particularly to the status of the venting module 10DV, such that frequency responses of the sound (e.g., SS2 shown in FIG. 8) perceived, under or corresponding to various venting module opening statuses, are consistent (meaning, more or less the same).

Specifically, with the equalization of the present application (via producing the sound according to the equalized input signal generated by the controller), a first frequency (magnitude) response of the sound perceived under a first opening status corresponding to a minimum degree of opening and a second frequency (magnitude) response of the sound perceived under a second opening status corresponding to a maximum degree of opening shall be substantially the same. That is, a difference between a first magnitude (or sound pressure level, SPL) of the sound perceived under the first opening status at a particular frequency and a second magnitude (SPL) of the sound perceived under the second opening status at the particular frequency is less than a certain/specific threshold, where the certain/specific threshold may be ±1 dB, ±3 dB or even ±5 dB, depending on how good user experience the supplier likes to provide. The sound perceived and/or the first/second (magnitude) frequency response may be obtained via acoustic measurement equipment and/or audio analyzing equipment.

Figure 4:
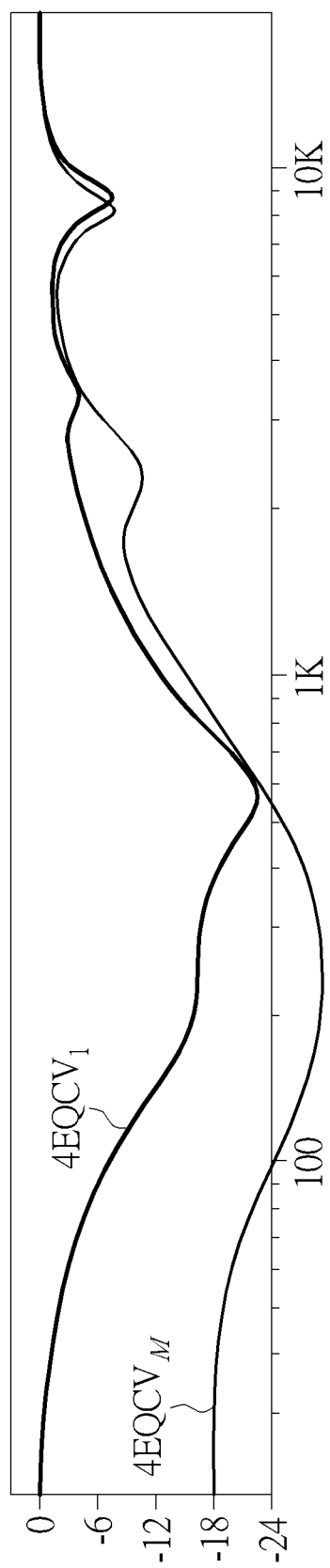
FIG. 4 is a schematic diagram of equalization curves according to an embodiment of the present application.

For example, FIG. 4 is a schematic diagram of equalization curves $4EQCV_1$ and $4EQCV_M$ according to an embodiment of the present application. The equalization curve $EQCV_1$ or $EQCV_M$ may be implemented by the equalization curve $4EQCV_1$ or $4EQCV_M$. In FIG. 4, the attenuation of the equalization curve $4EQCV_1$ or $4EQCV_M$ within the frequency range from 100 to 1000 Hz is approximately greater than the attenuation below 100 Hz, since the equalization curves $4EQCV_1$ and $4EQCV_M$ are intended to compensate for the deviation of the frequency response (at low frequencies). However, the attenuation of the equalization curve $4EQCV_1$ below 100 Hz is notably less than the attenuation of the equalization curve $4EQCV_M$ below 100 Hz, such that the equalization curve $4EQCV_1$ is more suitable for a status where low frequency roll off is more severe. For example, the equalization curve $4EQCV_1$ may be chosen for the both-open status, and the equalization curve $4EQCV_M$ may be chosen for the both-close status.

The equalizer 10EQ is able to ascertain the status of the venting module 10DV so as to make the selection of equalization curves. Specifically, the controller 10CTR may, according to its assessments or user's instruction, indicate to the driving circuits 10drvC1, 10drvC2 which status the venting module 10DV should be. The driving circuits 10drvC1 and 10drvC2 then drive (the actuators of) the venting devices 10DV1 and 10DV2 according to a control message Mctr provided by the controller 10CTR, respectively, to set the venting module 10DV to the specific status. Moreover, as the controller 10CTR possesses information about or has knowledge of which status the venting module 10DV should be or currently is, the equalizer 10EQ in the controller 10CTR is able to leverage the information about the status of the venting module 10DV (e.g., the control message Mctr) and select/adopt the corresponding/appropriate equalization curve (e.g., $EQCV_1$) among the equalization curves $EQCV_1$-$EQCV_M$ according to the information provided by the controller 10CTR to adjust/equalize an input signal Sin.

After the equalizer 10EQ converts the input signal Sin into the adjusted/equalized input signal SIN according to the chosen equalization curve (e.g., $EQCV_1$), the driving circuit 10drvC may drive the sound producing device 10SPD according to the adjusted/equalized input signal SIN sent from an output terminal of the equalizer 10EQ. The sound producing device 10SPD thus produces sound (e.g., SS1 shown in FIG. 8) in a manner corresponding to the adjusted/equalized input signal SIN. Since the equalizer 10EQ has already boosted the signal strength to overcome the low frequency attenuation, the low frequency sound generated by the sound producing device 10SPD is enhanced (e.g., when the venting module 10DV operates in the both-open status).

The term (opening) status is distinct from the term mode. The status of all the venting device(s) within the audio system 10 (i.e., the status of the venting module 10DV) may be influenced by the mode of one venting device, and the mode of each venting device together may define/form the status of the venting module 10DV. However, in terms of a single-vent configuration, the term status and the term mode may be used interchangeably.

In other words, the venting device 10DV1 or 10DV2 may operate in one of the open mode, the close mode and the comfort mode. The open, close and comfort modes of the venting device 10DV1/10DV2 form/define a plurality of statuses of the venting module 10DV.

For example, there are 3 different modes for a venting device and 3 different statuses for a single-vent configuration. FIG. 5 is a schematic diagram of three different modes of a venting device/module 50DV according to an embodiment of the present application. The venting device 10DV1 or 10DV2 may be implemented by the venting device 50DV. The venting device 50DV may include two flaps 511Fa, 511Fb, which are opposite to each other, and actuating portions 512Ca, 512Cb, which are driven by a driving circuit 50drvC and disposed on the flaps 511Fa and 511Fb, respectively. The flap 511Fa/511Fb may be actuated by the actuating portion 512Ca/512Cb to bend/pivot/tilt upward or downward to facilitate a dynamic vent 513vnt.

When the flap 511Fa is actuated to bend upward and the flap 511Fb is actuated to bend downward (or the flaps 511Fa and 511Fb swing oppositely), to form the vent 513vnt with a first opening width, the venting device 50DV is said to be operated in the open mode/status shown in FIG. 5 (a). An airflow passage is thus created between a volume 530chmF (connected to or to be connected to an ear canal) and a volume 530chmB (connected to or to be connected to the external ambient environment) to release/reduce pressure caused by occlusion effect. As a result, the frequency response curve (e.g., the thick solid curve shown in FIG. 2) drops off quite noticeably (as it extends towards lower frequencies).

Opening width herein can be evaluated as a distance between two tips of the two flaps (511Fa and 511Fb), which can be regarded as a kind of degree of opening.

When the flaps 511Fa and 511Fb align themselves substantially (or are actuated to be) parallel to each other to close/seal the vent 513vnt, the venting device 50DV is said to be operated in the close mode/status shown in FIG. 5 (b), and the vent 513vnt has a second opening width. In the close mode, the vent device 50DV blocks background noise from entering the ear canal for improved passive isolation. The volumes 530chmF and 530chmB are barely connected, which can avoid significant drops in sound pressure level (SPL) at lower frequencies (e.g., the thin solid curve shown in FIG. 2).

When the flaps 511Fa and 511Fb hang neutrally/loosely and/or tilt below the horizontal level corresponding to their anchored portions, the venting device 50DV is said to be operated in the comfort mode/status shown in FIG. 5 (c), and the vent 513vnt has a third opening width. The first opening width is the largest of the three, and the second opening width is narrower than the third opening width. That is, the degree of opening of the comfort mode is between the degree of opening of the open mode and the degree of opening of the close mode. The small vent 513vnt created in the comfort mode may relieve pressure building up in the ear canal to improve comfort and save energy. The frequency response curve (e.g., the thick solid curve shown in FIG. 2) corresponding to the comfort mode/status exhibits a gradual decrease toward the low-end of the spectrum.

In the comfort mode, the vent device 50DV is in its lowest power state, since low/no power would be applied on the actuators on the flaps (e.g., driving voltage applied on the actuator may be either 0V or floating). The position of the two vent flaps creates a small leak opening to relieve pressure build-up in the ear canal to improve earbud wearing comfort during an extended use.

Operating in the comfort mode may reduce ear canal pressure for extended earbud usage time, reduce static pressure built up in occluded ear canal and potentially reduce ear wax due to lower temperature and humidity in the ear canal. The vent device 50DV can be switched to the close mode when the user prefers increased passive isolation for ambient noise reduction and/or focused media listening.

On the other hand, an occluded ear increases in ear sensitivity, e.g., by 25 dB at 250 Hz. Occlusion effect creates a muffled, louder version of user's voice, footsteps, and chewing in user's head. Operating in the comfort mode creates a leak path that reduces the intensity level of occlusion effects while also limiting impact on the earbud battery life. The reduced leak also improves low-frequency bass feel during music play, over the open mode. For full occlusion effect cancelation, the vent device 50DV might be moved to the open mode, at the expense of higher energy consumption.

In addition, operating in the comfort mode also increase ambient awareness. Speech intelligibility may be improved, in the comfort mode over the close mode, by providing a physical passthrough for more natural one-on-one conversations, instead of digitally altered as with most active passthrough functions that use the microphone, digital signal processor (DSP) techniques and speaker to re-broadcast and amplify human voices. Safety would be improved, in the comfort mode over the close mode, by providing a direct and more natural passthrough of environmental and situational noise (e.g., on-coming car or siren). Of course, the vent device 50DV can be switched back to the close mode when the user prefers increased passive isolation for ambient noise reduction and/or focused media listening.

In short, there are 3 different statuses for a single-vent configuration. The equalizer 10EQ may obtain 3 equalization curves which are corresponding to the 3 different statuses of the only venting device (e.g., 50DV) in an audio system.

In an embodiment, there are 9 different statuses for a dual-vent configuration: Each venting device (e.g., 10DV1 or 10DV2) may operate in one of the three modes (e.g., the open mode, the close mode, and the comfort mode). Consequently, when both the venting devices 10DV1 and 10DV2 operate, the two venting devices 10DV1 and 10DV2 together yield a total of 3×3=9 different statuses (e.g., the both-open status, the both-close status, a both-comfort status, a one-open-one-close status, or a one-close-one-open status). The equalizer 10EQ may obtain 9 equalization curves (e.g., $EQCV_1$-$EQCV_9$) for the 9 different statuses of the venting module (e.g., 10DV).

In an embodiment, for a dual-vent configuration, the operation of two venting devices (e.g., 10DV1 and 10DV2) may be classified/simplified into 3 different statuses: The both-open status, the both-close status, and an only-one-open status. In the both-open status, both the venting devices 10DV1 and 10DV2 have their vents open and operate in the open mode. In the only-one-open status, one of the venting devices 10DV1 and 10DV2 operates in the open mode while the other operates in the close mode or in the comfort mode. In the both-close status, both the venting devices 10DV1 and 10DV2 operate in either in the close mode or the comfort mode. The equalizer 10EQ may obtain 3 equalization curves (e.g., $EQCV_1$-$EQCV_3$) which are corresponding to the 3 different statuses, respectively.

Using only 3 equalization curves (e.g., $EQCV_1$-$EQCV_3$) for two venting devices implicitly assumes that the difference between an equalization curve for the close mode/status and another equalization curve for the comfort mode/status is negligible, and that an equalization curve for the one-open-one-close status is indistinguishable from another equalization curve for the one-close-one-open status. For example, as the venting devices 10DV1 and 10DV2 are disposed symmetrically and fabricated identically, the frequency responses corresponding to the one-open-one-close status and the one-close-one-open status may be indiscernible, irrespective of whether the venting device 10DV1 or 10DV2 is in the open mode.

As set forth above, the total number of the equalization curves (e.g., $EQCV_1$-$EQCV_M$) may be equal to or related to the total number of the possible statuses of the venting module 10DV For example, corresponding to the 3 different statuses for a single-vent configuration, there are 3 equalization curves accessible to the equalizer 10EQ. Corresponding to the 3 (or 9) different statuses for a dual-vent configuration, there are 3 (or 9) equalization curves accessible to the equalizer 10EQ.

In an embodiment, the total number of the equalization curves (e.g., $EQCV_1$-$EQCV_M$) may be at least related to the total number of the venting device(s), the total number of modes of one venting device, or music style. For example, for the two venting devices 10DV1 and 10DV2, each of which has 3 different modes (e.g., the open mode, the close mode, and the comfort mode), the equalizer 10EQ may have access to $3^2$ different equalization curves.

In an embodiment, a total number of the equalization curves or a total number of a plurality of statuses among which the venting module 10DV performs may be at least 3, larger than 2. In other words, types of low frequency roll off which the audio system 10 can compensate are beyond the simply 2 types either-ON-or-OFF scenarios, which means, more than 2 types of low frequency roll off, where one is for open mode and the other is for close mode, can be compensated/equalized by the audio system 10. It is because 1) the venting device has an option of operating in the third comfort mode; and/or 2) the venting module with multiple venting devices has an option of more than 2 statues to operate thereon.

Figure 6:
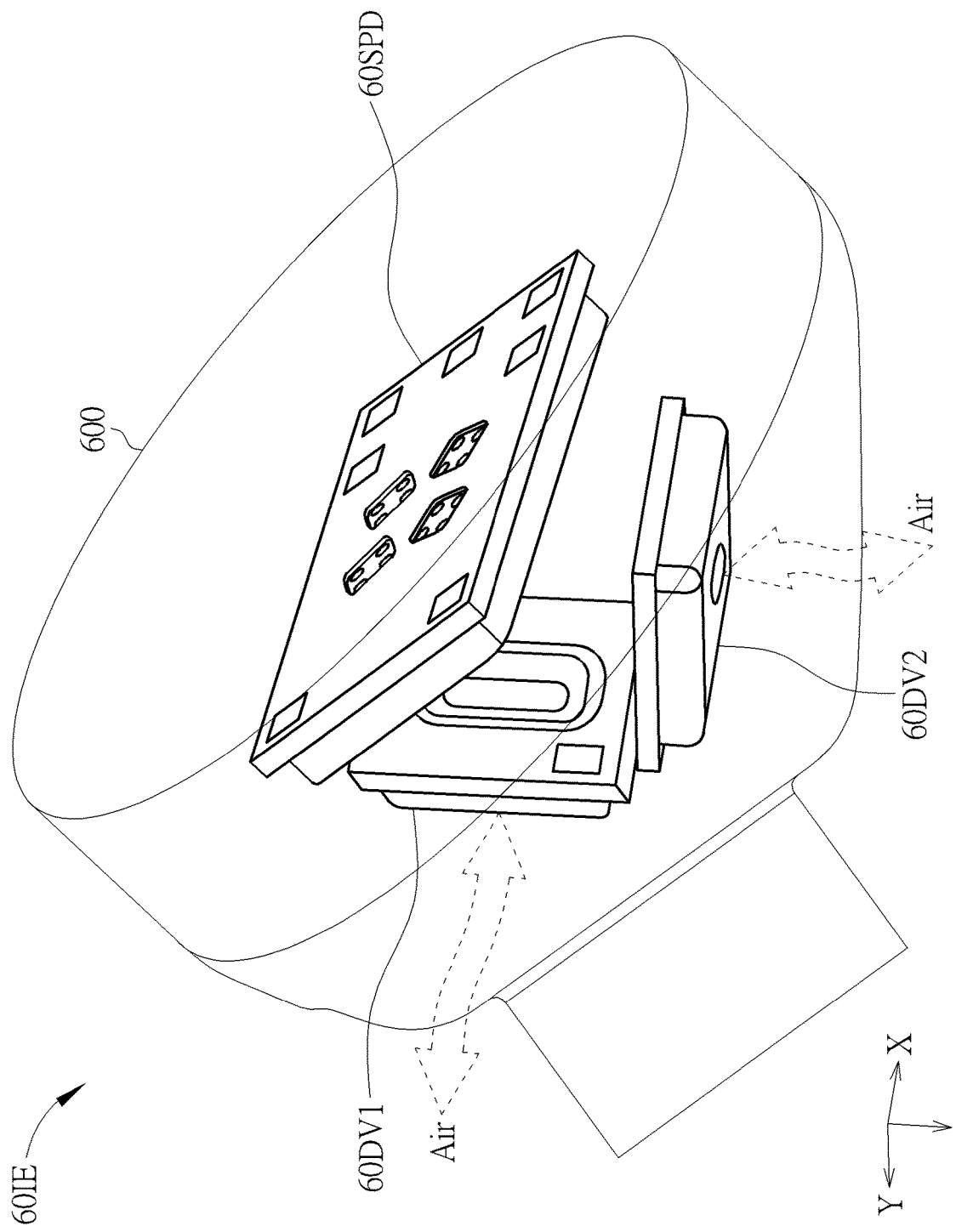
FIG. 6 is a schematic diagram of a wearable sound device according to an embodiment of the present application.

FIG. 6, which is a schematic diagram of a wearable sound device 60IE according to an embodiment of the present application, demonstrates an arrangement of the venting device(s) and the sound producing device. The wearable sound device 60IE (e.g., an in-ear device, an earbud, or a hearing aid) may include venting devices 60DV1, 60DV2, a sound producing device 60SPD, and driving circuits for the venting devices 60DV1, 60DV2, or the sound producing device 60SPD, all of which may be disposed within a housing 600. The venting devices 10DV1, 10DV2, and the sound producing device 10SPD may be implemented by the venting devices 60DV1, 60DV2, and the sound producing device 60SPD, respectively.

In FIG. 6, since two venting devices (i.e., 60DV1 and 60DV2) are disposed within one wearable sound device (i.e., 60IE), the total number of the venting devices equals to 2. However, the present application is not limited thereto. There may be a venting module comprising n venting devices disposed in one wearable sound device (i.e., 60IE), and the total number of the venting devices may be equal to n.

Corresponding to the statuses of the n venting devices of the venting module, the total number of the equalization curves (e.g., $EQCV_1$-$EQCV_M$) may be M, where n and M are positive integers (e.g., 1, 2, or 3). As set forth above, M may or may not be a function of n (e.g., $M=3^n$, $M=n+1$, $M=pxc^n$, or $M=(n+1) \times p$) or may be related to n (e.g., $M \geq n$), where c and p are positive integers, c represents the total number of modes (e.g., the open mode, the close mode, and the comfort mode) of one venting device, and p represents a coefficient which may be related to music style. Note that, the venting module comprising only one venting device is also within the scope of present application.

In an embodiment, the equalization curves (e.g., $EQCV_1$-$EQCV_M$) may be created/adjusted by a program automatically or by users manually. For example, the audio system 10 may utilize software to automatically generate/calculate equalization curves based on presets or algorithms so as to compensate for (low frequency) roll off of different statuses of the venting module. The audio system 10 may analyze all possible statuses of one wearable sound device (i.e., 601E) and generate/adjust equalization curves in advance for subsequent optimization of audio quality.

Alternatively, a user may use a graphical user interface (GUI) application of graphic equalizer with a series of physical or virtual sliders to control the volume of each frequency band. After the user adjusts the sliders to design customized equalization curves manually, overall audio quality may be enhanced according to the individual preferences and needs. The curve displayed graphically by the sliders may correspond to an equalization curve (e.g., $EQCV_1$) for addressing (low frequency) roll off of different statuses of the venting module. Alternatively, a user may manipulate parameters such as center frequency, bandwidth, or amplitude of each frequency band using an application of parametric equalizer to create a tailored equalization curve (e.g., $EQCV_1$) for addressing (low frequency) roll off of different statuses of the venting module. The equalization curves created automatically or manually may be stored in a storage circuit or a lookup table.

In an embodiment as shown in FIG. 6, the venting devices 60DV1 and 60DV2 may be disposed symmetrically. When the venting device 60DV1 or 60DV2 operate in the open mode to open its vent, air may flow in the directions shown by the corresponding dashed arrow.

Please refer to FIGS. 1 and 6. The controller 10CTR may or may not be disposed within the wearable sound device 60IE. The venting devices 60DV1, 60DV2, or the sound producing device 60SPD may be communicatively coupled to the controller 10CTR via a wireless/wired connection to deliver signals (e.g., the control message Mctr or the adjusted/equalized input signal SIN) between the controller 10CTR and the venting device 60DV1, 60DV2, or the sound producing device 60SPD. The wireless connection may be short range connection such as IEEE 802.15.4 (ZigBee) or Bluetooth, medium range connection such as Wi-Fi, long range connection such as LTE or 5G. The controller 10CTR may be disposed in an electronic device such as a smart phone, a tablet or other devices which meet most fast computing needs and have massive battery capacities. Leveraging the computing resource of the electronic device may reduce the complexity, power consumption, or extend battery life of the wearable sound device 60IE by offloading all (computation) processing to the electronic device.

The controller 10CTR may receive status instruction about the status of the venting module (e.g., 10DV) via a wireless/wired connection (e.g., Bluetooth) from other device(s). For example, users may provide information/ instruction about the status of the venting module to the controller 10CTR via a GUI of a device, which includes the controller 10CTR or is communicatively coupled to the controller 10CTR via a wireless/wired connection, such that the users can open/close the vent(s) dynamically. Alternatively, a sensor may notify the controller 10CTR of the status of the venting module to force the vent(s) to open/close dynamically.

The controller 10CTR for indirectly or directly controlling the venting devices (e.g., 60DV1 and 60DV2) or the sound producing device (e.g., 60SPD) may operate in digital domain. The equalizer 10EQ disposed within the controller 10CTR may operate in digital domain. The equalizer 10EQ may be an equalization filter or include a set of (programed or programable) filters. In an embodiment, the controller 10CTR may be realized by system on chip (SoC), but not limited thereto.

The driving circuit 10drvC for driving the sound producing device (e.g., 60SPD) may include an analog amplifier or a digital-to-analog converter (DAC).

The driving circuit 10drvC1 or 10drvC2 for driving the venting device (e.g., 60DV1 or 60DV2) may include an (analog) amplifier. The driving circuit (e.g., 60DV1 or 60DV2) may provide driving voltage(s) to the venting device 10DV1 or 10DV2 according to the control message Mctr sent by the controller 10CTR, such that the venting device (e.g., 60DV1 or 60DV2) operates in the mode specified by the control message Mctr. In an embodiment, the driving circuit 10drvC1 or 10drvC2 may include the driving circuit disclosed in U.S. application Ser. No. 18/366,637, which is not limited thereto.

In an embodiment, the driving circuits 10drvC, 10drvC1 or 10drvC2 may or may not be disposed within the wearable sound device, depending on practical requirements. In an embodiment, the driving circuit 10drvC and the sound producing device 10SPD can be integrated in a sound producing package. Similarly, the venting device (10DV1) and its corresponding driving circuit (10drvC1) can be integrated in a venting package. The sound producing package and the venting package can be both disposed in the wearable sound device.

Moreover, the venting device (e.g., 60DV1 or 60DV2) may be a Micro Electro Mechanical System (MEMS) device. The sound producing device (e.g., 60SPD) may be or comprise any type of electroacoustic transducer (e.g., a MEMS device), any type of speaker, or a combination thereof. For example, MEMS fabricated venting device or sound producing device disclosed in U.S. application Ser. No. 17/842,810, Ser. No. 17/344,980, Ser. No. 17/344,983, Ser. No. 17/720,333 may be exploited in the audio system or the wearable sound device of the present application, which is not limited thereto.

For example, as taught in Ser. No. 17/842,810, Ser. No. 17/344,980, and Ser. No. 17/344,983, the venting device within the venting module may comprise a film structure with a slit formed thereon, such that a vent, connecting a volume within the wearable sound device (and/or a volume of ear canal) and ambient, can be formed because of the slit.

Furthermore, Ser. No. 17/842,810, Ser. No. 17/344,980, and Ser. No. 17/344,983 also teach an acoustic transducer comprise a film structure which can be actuated to form at least one vent (to connect a volume within wearable sound device or ear canal with ambient) as well as perform acoustic transformation (e.g., producing sound). Disposing the acoustic transducer capable of both forming the vent and producing sound via equalized input signal are also within the scope of the present application.

In an embodiment, the film structure of the acoustic transducer capable of both forming vent and producing sound may have similar structure as the flaps shown FIG. 5, as an example but not limited thereto. Acoustic transducer may comprise a first membrane for forming the vent(s) (as venting device(s)) and a second membrane for producing sound (as sound producing device), where the first and second membrane can be regarded as film structure. In another view, the venting device 10DV1/10DV2 and the sound producing device 10SPD shown in FIG. 1 may be viewed together as an acoustic transducer of the present application.

In an embodiment, the wearable sound device may comprise only one venting device, which is also within the scope of the present application.

As long as the equalized input signal is used for producing sound in wearable sound device to counteract roll off caused by the at least one vent in response to a plurality of degrees of opening so that the sound perceived has substantially consistent (magnitude) frequency response, requirements of present application is satisfied and it is within the scope of the present application.

Figure 7:
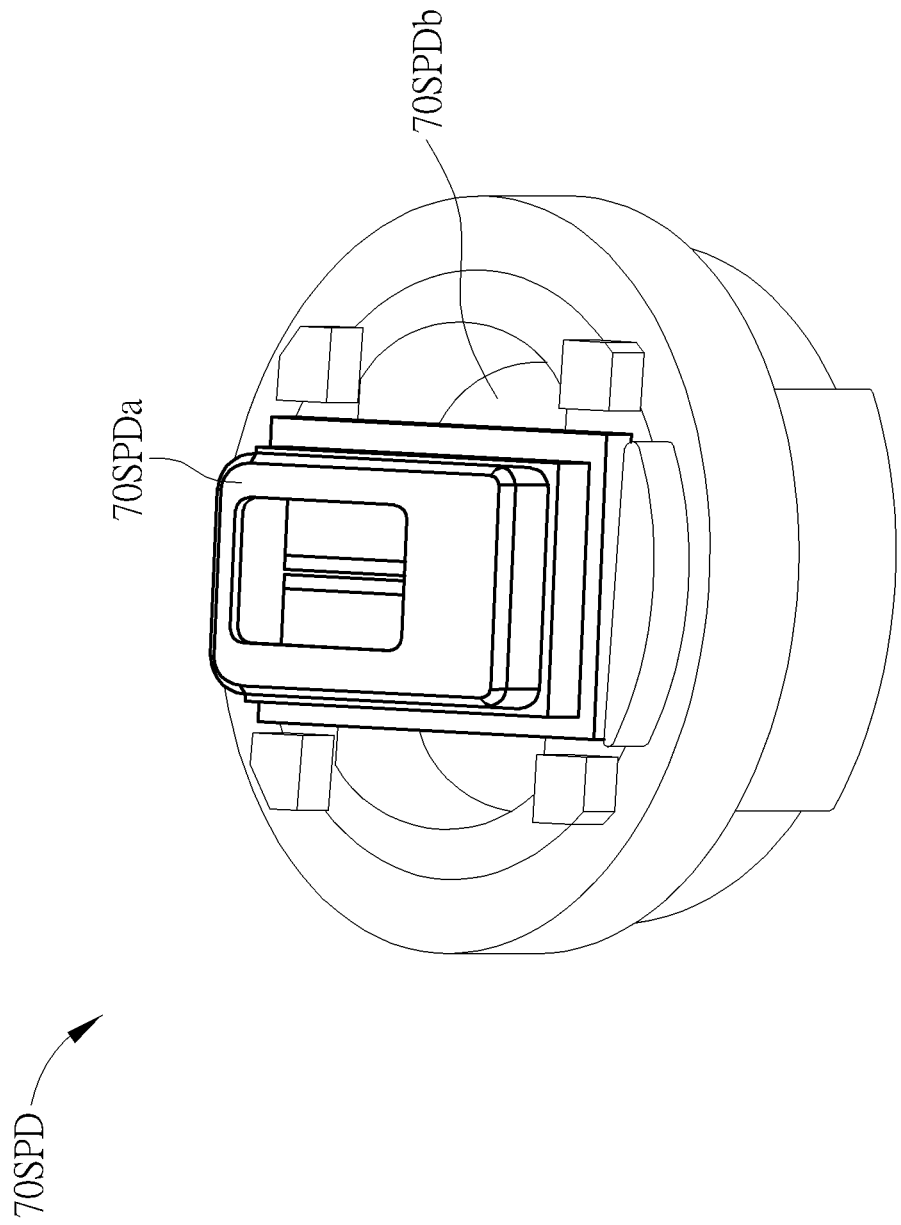
FIG. 7 is a schematic diagram of a sound producing device according to an embodiment of the present application.

FIG. 7 is a schematic diagram of a sound producing device 70SPD according to an embodiment of the present application. The sound producing device 10SPD or 60SPD may be implemented by the sound producing device 70SPD. The sound producing device 70SPD may include a two-way speaker, which include sound producing sub-devices 70SPDa and 70SPDb. The sound producing sub-devices 70SPDa and 70SPDb may function as a tweeter and a woofer, respectively. The sound producing sub-device 70SPDa may be implemented by a MEMS device, which may be, e.g., disclosed in Ser. No. 17/720,333. The sound producing sub-device 70SPDb may be implemented by an audio dynamic driver or a moving-coil speaker. Preferably, the sound producing sub-device 70SPDb, serving as a woofer, may be selected to be able to provide/generate higher volume (than a tweeter) or sufficient acoustic driving capability at low frequencies, so as to facilitate acoustic equalization at low frequencies.

Figure 8:
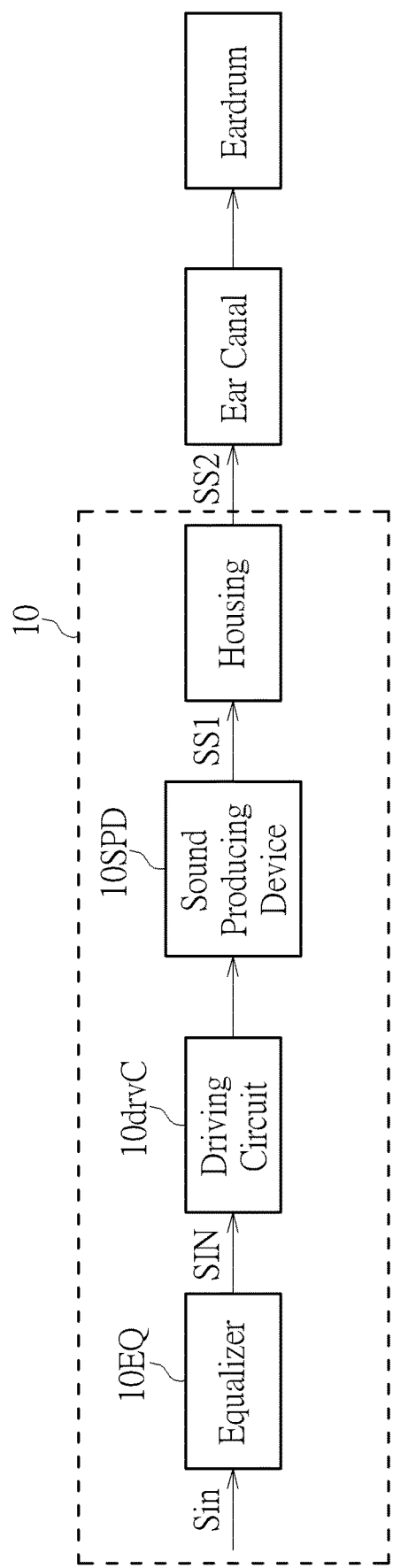
FIG. 8 is a schematic diagram of signal transmission and sound prorogation mechanism according to an embodiment of the present application.

FIG. 8 is a schematic diagram of signal transmission mechanism and sound propagation mechanism according to an embodiment of the present application. After the equalizer 10EQ in response to the input signal Sin outputs the adjusted/equalized input signal SIN according to one chosen equalization curve (e.g., $EQCV_1$), the sound producing device 10SPD may produces sound SS1. The sound SS1 traveling from the sound producing device 10SPD toward an eardrum of a listener may be reshaped/distorted and transformed into sound SS2 when it passes/encounters a cover/housing (e.g., 600) of a wearable sound device (e.g., 60IE). Compared with the sound SS1, low frequency roll off may occur in the sound SS2 because of the status of the venting module (e.g., 10DV). Nevertheless, since the low frequency roll off has been already compensated/counteracted by the equalizer 10EQ, the acoustic effect of the sound SS2 is eventually in line with expectations.

Referring to FIGS. 1 and 8, when the venting devices 10DV1 and 10DV2 are switched from the both-close status to the both-open status in response to the control message Mctr signaled by the controller 10CTR, the closed vents of the venting devices 10DV1 and 10DV2 are opened. As a result, the acoustic properties of the cover/housing of the wearable sound device (e.g., 60IE) change, which may lead to increased low frequency roll off in the sound SS2.

Meanwhile, prompted by the control message Mctr indicating the both-open status, the equalizer 10EQ swaps one equalization curve (e.g., 4EQCV$_M$) with another equalization curve (e.g., 4EQCV$_1$) to treat the input signal Sin differently based on status. The adjusted/equalized input signal SIN, which may be divided into a first frequency component (e.g., a low frequency component) and a second frequency component (e.g., a middle frequency component), corresponding to the both-open status may have been modified by the equalizer 10EQ differently from the adjusted/equalized input signal SIN corresponding to the both-close status. Therefore, the difference between the first frequency component corresponding to the both-open status and the first frequency component corresponding to the both-close status may be different from (or greater than) the difference between the second frequency component corresponding to the both-open status and the second frequency component corresponding to the both-close status; the difference between the first frequency component and the second frequency component corresponding to the both-open status may be different from (or greater than) the difference between the first frequency component and the second frequency component corresponding to the both-close status.

For example, the equalizer 10EQ may tend to attenuate the first frequency component less for the both-open status than for the both-close status, and thus the sound producing device 10SPD is inclined to render first frequency sound (e.g., low frequency sound) of the sound SS1 louder for the both-open status than for the both-close status. Subsequently, the stronger first frequency sound of the sound SS1 propagating through the wearable sound device may be diminished more and transformed into first frequency sound of the sound SS2, which may be however in line with expectations. For example, the acoustic effect of the sound SS2 in the both-close status may approach the acoustic effect of the sound SS2 in the both-open status.

In other words, for the dynamic vent(s) of the venting devices 10DV1 or 10DV2, the equalizer 10EQ performs switchable equalization dynamically to achieve the desired audio balance. The transformation by the equalizer 10EQ and the sound transmission channel of the wearable sound device and the ear canal may result in a similar acoustic effect for the sound SS2 in one status (e.g., both-open status) as observed in another status (e.g., both-close status).

The frequency response may involves exciting the sound producing device 10SPD with a sophisticatedly-designed input signal and measuring the resulting sound at an eardrum of a listener (or at an occluded ear canal simulator such as a 711 coupler).

Figure 9:
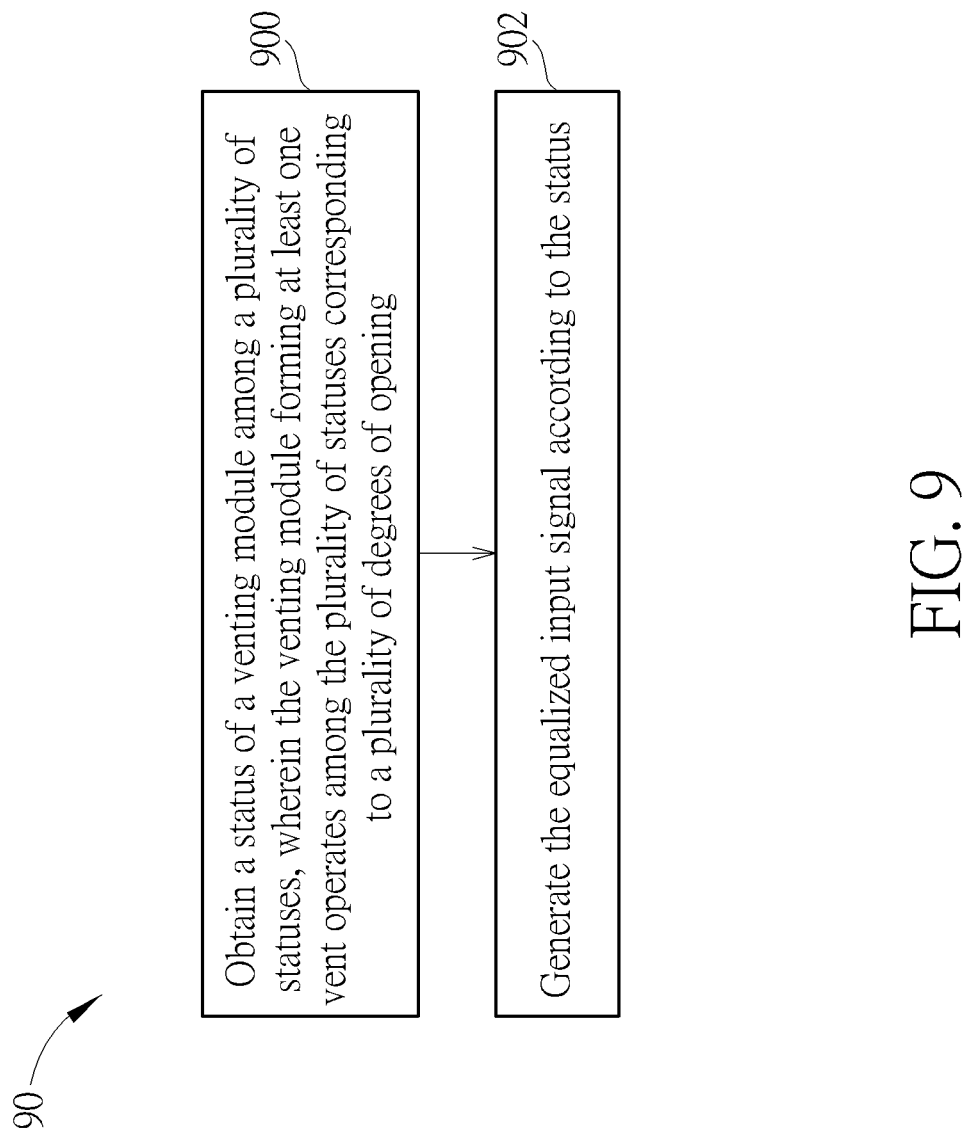
FIG. 9 is a schematic diagram of an equalizing process according to an embodiment of the present application.

Operations of the equalization can be summarized as an equalizing process 90, shown in FIG. 9. The equalizing process 90 comprises following steps.

Step 900: Obtain a status of a venting module among a plurality of statuses, wherein the venting module forming at least one vent operates among the plurality of statuses corresponding to a plurality of degrees of opening.

Step 902: Generate the equalized input signal according to the status.

Details of the equalizing process 90 can be referred to paragraphs stated in the above, which would not be narrated herein for brevity.

Details or modifications of a wearable sound device, a sound producing device, a venting device, a driving circuit, or a controller are disclosed in U.S. application Ser. No. 17/842,810, Ser. No. 17/344,980, Ser. No. 17/344,983, Ser. No. 17/720,333, Ser. No. 18/172,346, Ser. No. 18/303,599, Ser. No. 18/366,637, Ser. No. 18/530,235, and U.S. Provisional Application No. 63/320,703, the disclosure of which is hereby incorporated by reference herein in its entirety and made a part of this specification.

The use of ordinal terms such as "first" and "second" does not by itself imply any priority, precedence, or order of one element over another, the chronological sequence in which acts of a method are performed, or the necessity for all the elements to be exist at the same time, but these terms are simply used as labels to distinguish one element having a certain name from another element having the same name. The technical features described in the following embodiments may be mixed or combined in various ways as long as there are no conflicts between them.

To sum up, the present application discovers the varied impact that different statuses of venting device(s) may have on audio quality. Accordingly, the present application offers multiple (e.g., more than 2) equalization curves which are corresponding different statuses of venting device(s), respectively. Moreover, an equalizer of the present application is able to choose from the equalization curves for the present status, the anticipated status, or the status-to-be of the venting device(s) to improve audio experience or enhance sound quality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wearable sound device, comprising:
a venting module, comprising at least one venting device, configured to form at least one vent to connect a volume within the wearable sound device and ambient; and
a sound producing device, configured to produce sound according to an equalized input signal;
wherein the venting module operates among a plurality of statuses corresponding to a plurality of degrees of opening;
wherein a controller generates the equalized input signal according to a degree of opening among the plurality of degrees of opening, in order to counteract a roll off caused by the at least one vent.

2. The wearable sound device of claim 1,
wherein the sound perceived under a first status with a minimum degree of opening is corresponding to a first frequency response;
wherein the sound perceived under a second status with a maximum degree of opening is corresponding to a second frequency response;
wherein a difference between the first frequency response and the second frequency response is less than a specific threshold.

3. The wearable sound device of claim 1, wherein a venting device within the venting module operates in a mode among a plurality of modes, the plurality of modes of the at least one venting device forms the plurality of statuses of the venting module.

4. The wearable sound device of claim 3, wherein the plurality of modes comprises a close mode, an open mode or a comfort mode.

5. The wearable sound device of claim 4,
wherein a degree of opening of the comfort mode is between a degree of opening of the open mode and a degree of opening of the close mode.

6. The wearable sound device of claim 4,
wherein the venting device comprises a first flap and a second flap;
wherein in the open mode, the first flap is actuated to bend upward and the second flap is actuated to bend downward;
wherein in the close mode, the first flap and the second flap are actuated to be parallel to each other;
wherein in the comfort mode, the first flap and the second flap hang below a level corresponding to their anchored portions.

7. The wearable sound device of claim 1, wherein the controller utilizes a first equalization curve among a plurality of equalization curves according to a first status of the venting module to generate the equalized input signal.

8. The wearable sound device of claim 7, wherein in response to a control message about switching from the first status to a second status, the controller replaces the first equalization curve with a second equalization curve of the plurality of equalization curves.

9. The wearable sound device of claim 7, wherein the first status is decided by the controller or conveyed to the controller from a user or a device communicatively coupled to the controller.

10. The wearable sound device of claim 7, wherein a control message about the first status of the venting module is received by the controller or transmitted toward the at least one venting device via a wireless or wired connection.

11. The wearable sound device of claim 7, wherein each of the plurality of equalization curves is created or edited parametrically, graphically, automatically, or manually corresponding to one of a plurality of statuses of the venting module.

12. The wearable sound device of claim 7, wherein a total number of the plurality of equalization curves is at least related to a total number of the at least one venting device or a total number of modes of one of the at least one venting device.

13. The wearable sound device of claim 1, wherein the controller is disposed within the wearable sound device.

14. The wearable sound device of claim 1, wherein the controller is disposed within an electronic device communicatively coupled to the wearable sound device.

15. The wearable sound device of claim 1, wherein the equalized input signal is transmitted from the controller toward the sound producing device via a wireless or wired connection.

16. The wearable sound device of claim 1, wherein the controller utilizes a plurality of equalization curves corresponding to the plurality of statuses to generate the equalized input signal.

17. The wearable sound device of claim 1, wherein a number of the plurality of statuses is larger than 2.

18. The wearable sound device of claim 1, wherein a venting device within the venting module comprises a film structure with a slit formed thereon, a vent of the at least one vent is formed because of the slit.

19. The wearable sound device of claim 1,
wherein the sound producing device comprises a first sound producing sub-device functioning as a tweeter and a second sound producing sub-device functioning as a woofer.

20. The wearable sound device of claim 19, wherein the first sound producing sub-device is MEMS (Micro Electro Mechanical System) fabricated.

21. The wearable sound device of claim 19, wherein the second sound producing sub-device comprises an audio dynamic driver or a moving-coil speaker.

22. A device, comprising:
a controller, configured to generate an equalized input signal according to a degree of opening among a plurality of degrees of opening of a venting module;
wherein the controller is coupled to a sound producing device;
wherein the sound producing device is configured to produce sound according to the equalized input signal;
wherein the venting module is configured to form at least one vent and has the plurality of degrees of opening;
wherein the controller generating the equalized input signal is to counteract a roll off due to the at least one vent.

23. The device of claim 22, wherein the controller utilizes a first equalization curve among a plurality of equalization curves according to a first status of the venting module to generate the equalized input signal.

24. An equalizing method, configured to generate an equalized input signal for a sound producing device,
the equalizing method comprising:
obtaining a status of a venting module among a plurality of status, wherein the venting module forming at least one vent operates among the plurality of statuses corresponding to a plurality of degrees of opening; and
generating the equalized input signal according to the status;
wherein a controller generates the equalized input signal according to a degree of opening among the plurality of degrees of opening, in order to counteract a roll off caused by at least one vent.

25. The equalizing method of claim 24, comprising:
utilizing a first equalization curve among a plurality of equalization curves according to a first status of the venting module to generate the equalized input signal.

26. The equalizing method of claim 25, further comprising:
switching from the first equalization curve to a second equalization curve of the plurality of equalization curves in response to a control message about switching the first status to a second status.

27. The equalizing method of claim 25, wherein the plurality of equalization curves is established either parametrically, graphically, automatically, or according to user instruction corresponding to one of a plurality of statuses of the venting module.

28. A wearable sound device, comprising:
an acoustic transducer, configured to form at least one opening to connect a volume within the wearable sound device and ambient and configured to produce sound according to an equalized input signal;
wherein the acoustic transducer operates among a plurality of statuses corresponding to a plurality of degrees of opening;
wherein a controller generates the equalized input signal according to a degree of opening among the plurality of degrees of opening, in order to counteract a roll off caused by at least one vent.

* * * * *